(12) United States Patent
Ishikawa et al.

(10) Patent No.: US 7,433,187 B2
(45) Date of Patent: Oct. 7, 2008

(54) HEAT SPREADER MODULE

(75) Inventors: Takahiro Ishikawa, Toyoake (JP);
Masayuki Shinkai, Ama-Gun (JP);
Makoto Miyahara, Nagoya (JP);
Shuhei Ishikawa, Handa (JP); Nobuaki Nakayama, Obu (JP); Seiji Yasui, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 11 days.

(21) Appl. No.: 10/807,674

(22) Filed: Mar. 24, 2004

(65) Prior Publication Data

US 2004/0191558 A1 Sep. 30, 2004

(30) Foreign Application Priority Data

Mar. 28, 2003 (JP) ............................ 2003-092511

(51) Int. Cl.
*H05K 7/20* (2006.01)

(52) U.S. Cl. ................... 361/688; 361/700; 361/708

(58) Field of Classification Search ......... 361/780–795; 174/251; 428/557, 627, 209–210; 165/185–190
See application file for complete search history.

(56) References Cited

U.S. PATENT DOCUMENTS

| | | | | |
|---|---|---|---|---|
| 4,583,283 A | * | 4/1986 | Dubois et al. ................. | 29/856 |
| 5,050,040 A | | 9/1991 | Gondusky et al. | |
| 5,291,065 A | * | 3/1994 | Arai et al. .................... | 257/723 |
| 5,354,415 A | * | 10/1994 | Fushii et al. .................. | 216/13 |
| 5,561,321 A | | 10/1996 | Hirano et al. | |
| 5,608,267 A | * | 3/1997 | Mahulikar et al. ........... | 257/796 |
| 5,650,663 A | * | 7/1997 | Parthasarathi ................ | 257/706 |
| 5,834,840 A | * | 11/1998 | Robbins et al. .............. | 257/705 |
| 6,032,362 A | * | 3/2000 | Okikawa et al. ............. | 29/890.03 |
| 6,110,577 A | * | 8/2000 | Ishikawa et al. ............. | 428/307.7 |
| 6,261,703 B1 | * | 7/2001 | Sasaki et al. ................. | 428/627 |
| 6,282,095 B1 | * | 8/2001 | Houghton et al. ............ | 361/704 |
| 6,316,826 B1 | * | 11/2001 | Yamamoto et al. .......... | 257/705 |
| 6,331,730 B1 | * | 12/2001 | Terasaki et al. .............. | 257/688 |
| 6,343,647 B2 | * | 2/2002 | Kim et al. .................... | 165/185 |
| 6,507,105 B1 | | 1/2003 | Yamagata et al. | |
| 6,579,623 B2 | * | 6/2003 | Kurihara et al. ............. | 428/556 |

(Continued)

FOREIGN PATENT DOCUMENTS

DE 103 24 190 1/2005

(Continued)

OTHER PUBLICATIONS

U.S. Appl. No. 11/515,638, filed Sep. 5, 2006, Ishikawa.

*Primary Examiner*—Tuan T Dinh
(74) *Attorney, Agent, or Firm*—Burr & Brown

(57) ABSTRACT

A heat spreader module has a pedestal, a heat spreader member joined to the pedestal by a first active hard brazing material, an intermediate layer joined to the heat spreader member by a second active hard brazing material, an insulating board joined to the intermediate layer by a third active hard brazing material, and a circuit board joined to the insulating board by a fourth active hard brazing material. The first through fourth active hard brazing materials are supplied such that the active hard brazing materials have a thickness ranging from 3 to 20 µm when the components of the heat spreader module are joined together under pressure, and contain an active element in an amount ranging from 400 to 1000 µg/cm².

2 Claims, 17 Drawing Sheets

U.S. PATENT DOCUMENTS

| | | | |
|---|---|---|---|
| 6,663,969 B2 * | 12/2003 | Masayuki et al. | 428/414 |
| 6,690,087 B2 * | 2/2004 | Kobayashi et al. | 257/686 |
| 6,831,351 B2 * | 12/2004 | Hirao et al. | 257/625 |
| 6,846,987 B2 | 1/2005 | Lucke et al. | |
| 6,911,728 B2 | 6/2005 | Ishikawa et al. | |
| 7,032,652 B2 | 4/2006 | Wang et al. | |
| 7,069,645 B2 * | 7/2006 | Ishikawa et al. | 29/830 |
| 7,161,807 B2 | 1/2007 | Ishikawa et al. | |
| 2001/0052642 A1 * | 12/2001 | Wood et al. | 257/690 |
| 2002/0175403 A1 * | 11/2002 | Sreeram et al. | 257/702 |
| 2003/0201530 A1 | 10/2003 | Kurihara et al. | |
| 2004/0130018 A1 | 7/2004 | Sugiyama et al. | |
| 2004/0191558 A1 | 9/2004 | Ishikawa et al. | |
| 2007/0274047 A1 | 11/2007 | Nagase et al. | |

FOREIGN PATENT DOCUMENTS

| | | |
|---|---|---|
| GB | 2 382 082 | 5/2003 |
| JP | 2001-007265 | 1/2001 |
| JP | 2001-339022 | 12/2001 |
| JP | 2002-43482 | 2/2002 |
| JP | 2003-055058 | 2/2003 |
| JP | 2003-309232 | 10/2003 |
| JP | 2004-221605 | 8/2004 |
| JP | 2004-303818 | 10/2004 |

* cited by examiner

C1, C2, E1, E2

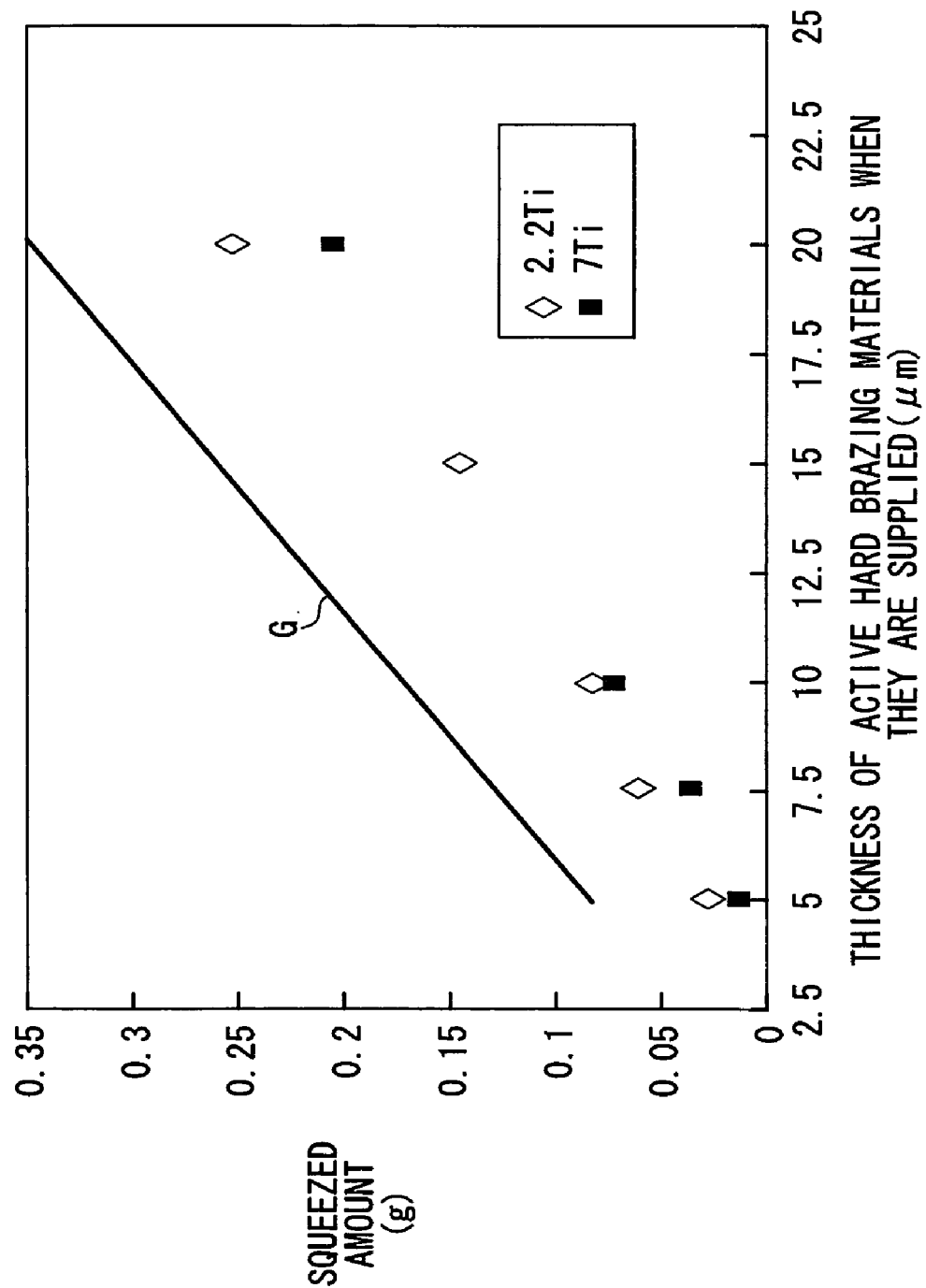

FIG. 15

| SAMPLE | ACTIVE HARD BRAZING MATERIAL COMPOSITION | W1 (mg/cm²) | W2 (μg/cm²) | JUDGED BONDING STRENGTH |
|---|---|---|---|---|
| 1 | 60Ag-24.7Cu-14In-1.3Ti | 2.91 | 37.83 | NG |
| 2 | DITTO | 4.85 | 63.05 | OK |
| 3 | DITTO | 7.28 | 94.64 | OK |
| 4 | DITTO | 9.7 | 126.1 | OK |
| 5 | DITTO | 19.4 | 252.2 | OK |
| 6 | 59.8Ag-24Cu-14In-2.2Ti | 2.91 | 64.02 | OK |
| 7 | DITTO | 4.85 | 106.7 | OK |
| 8 | DITTO | 7.28 | 160.16 | OK |
| 9 | DITTO | 9.7 | 213.4 | OK |
| 10 | DITTO | 19.4 | 426.8 | OK |

FIG. 17

| SAMPLE | ACTIVE HARD BRAZING MATERIAL COMPOSITION | W1 (mg/cm²) | W2 (μg/cm²) | JUDGED BONDING STRENGTH | λm (W/mK) | hm (mg) | JUDGED ALLOYING |
|---|---|---|---|---|---|---|---|
| 1 | 60Ag-24.7Cu-14In-1.3Ti | 9.7 | 126.1 | NG | 368 | 180 | ○ |
| 2 | DITTO | 19.4 | 252.2 | NG | 366 | 576 | ○ |
| 3 | DITTO | 29.1 | 378.3 | NG | 367 | 984 | × |
| 4 | DITTO | 48.5 | 630.5 | OK | 368 | 1440 | × |
| 5 | 59.8Ag-24Cu-14In-2.2Ti | 4.85 | 106.7 | NG | 368 | 72 | ◎ |
| 6 | DITTO | 7.28 | 160.16 | NG | 368 | 144 | ◎ |
| 7 | DITTO | 9.7 | 213.4 | NG | 367 | 204 | ○ |
| 8 | DITTO | 14.55 | 320.1 | OK | 368 | 360 | ○ |
| 9 | DITTO | 19.4 | 426.8 | OK | 366 | 624 | ○ |
| 10 | DITTO | 29.1 | 640.2 | OK | 368 | 936 | × |
| 11 | DITTO | 48.5 | 1067 | OK | 355 | 1488 | × |
| 12 | 58.4Ag-23.5Cu-13.5In-4.5Ti | 4.85 | 218.25 | NG | 368 | 48 | ◎ |
| 13 | DITTO | 7.28 | 327.6 | OK | 366 | 96 | ◎ |
| 14 | DITTO | 9.7 | 436.5 | OK | 367 | 192 | ○ |
| 15 | DITTO | 14.55 | 654.75 | OK | 366 | 360 | ○ |
| 16 | DITTO | 19.4 | 873 | OK | 350 | 552 | ○ |
| 17 | DITTO | 29.1 | 1309.5 | OK | 344 | 840 | × |
| 18 | 58Ag-22Cu-13In-7Ti | 4.85 | 339.5 | OK | 361 | 36 | ◎ |
| 19 | DITTO | 7.28 | 509.6 | OK | 366 | 96 | ◎ |
| 20 | DITTO | 9.7 | 679 | OK | 367 | 168 | ○ |
| 21 | DITTO | 14.55 | 1018.5 | OK | 358 | 336 | ○ |
| 22 | DITTO | 19.4 | 1358 | OK | 349 | 504 | ○ |
| 23 | DITTO | 29.1 | 2037 | OK | 334 | 888 | × |

HEAT SPREADER MODULE

This application claims the benefit of Japanese Application 2003-092511, filed Mar. 28, 2003, the entirety of which is incorporated herein by reference.

BACKGROUND OF THE INVENTION

1. Field of the Invention

The present invention relates to a heat spreader module for cooling an IC chip or the like which comprises semiconductors, etc.

2. Description of the Related Art

Generally, a heat spreader module for effectively dissipating the heat of a semiconductor device such as an IGBT (Insulated Gate Bipolar Transistor) or the like comprises a circuit board, an insulating board, a heat spreader member (heat diffusion layer), and a pedestal. If necessary, stress dampening layers may be disposed between these components of the heat spreader module. Heretofore, it has been customary to join these components with a solder layer (having a melting point of about 250° C.).

However, the solder layers pose a large heat resistance, and the manufacturing cost for the heat spreader module is high because of two joining processes required, i.e., a process of brazing the circuit board and the insulating board to each other and a process of joining the joined assembly to the pedestal.

The inventor of the present invention has disclosed, in Japanese laid-open patent publication No. 2002-43482, a process of joining a circuit board, an insulating board, an intermediate layer, and a heat sink with an active hard brazing material under pressure and heat all in one sequence, leaving no joining layers which would pose a heat resistance. According to the disclosed process, a heat spreader module having a high thermal conductivity can be manufactured inexpensively.

According to the above process of completing the joining of the components in one sequence, if the active hard brazing material is excessively supplied, then excess active hard brazing material is squeezed out around the pedestal when the components are joined. The need to remove the squeezed active hard brazing material results in an increase in the manufacturing cost.

The melted hard brazing material that is squeezed out is brought into contact with side edges of copper plates that are used as the circuit board and the dampening layers. When the active hard brazing material and the copper plates contact each other, they are alloyed, and the alloyed region has an electric conductivity and a thermal conductivity lower than those of copper, or has durability increased to make the stress dampening capability lower than that of copper, resulting in a reduction in the quality of the heat spreader module.

One solution is to reduce the supplied amount of the active hard brazing material for preventing excess active hard brazing material from being squeezed out around the pedestal. However, a reduction in the supplied amount of the active hard brazing material tends to cause a shortage of the absolute amount of active elements required to join the components, giving rise to a new problem in that a necessary bonding strength cannot be achieved.

SUMMARY OF THE INVENTION

It is therefore an object of the present invention to provide a heat spreader module which does not produce excess active hard brazing material and achieves a necessary bonding strength when components of the heat spreader module are joined, and a method of manufacturing such a heat spreader module.

According to the present invention, there is provided a method of manufacturing a heat spreader module having a heat spreader member, an insulating board, and a metal plate which are joined to a pedestal, comprising the steps of supplying active hard brazing materials each containing an active element, between the pedestal, the heat spreader member, the insulating board, and the metal plate, and pressing and heating the pedestal, the heat spreader member, the insulating board, and the metal plate to melt the active hard brazing materials, thereby joining the pedestal, the heat spreader member, the insulating board, and the metal plate together, the active hard brazing materials being supplied such that the active hard brazing materials have a thickness ranging from 3 to 20 µm when the active hard brazing materials are melted, the active element being contained in an amount ranging from 400 to 1000 µg/cm$^2$.

Since the active hard brazing materials are supplied such that their thickness is in the range from 3 to 20 µm at the time they are melted, when the pedestal, the heat spreader member, the intermediate layer, the insulating board, and the metal plate are joined together under pressure and heat, any amount of the active hard brazing materials that is squeezed out is essentially eliminated or greatly reduced. Therefore, the step of removing any squeezed-out active hard brazing material may be dispensed with, and the manufacturing cost of the heat spreader module may be lowered. Furthermore, alloying of the surface of the metal plate, squeezing-out of the active hard brazing materials onto a side edge of a copper plate used as a buffer layer, and a reduction in a stress dampening capability due to alloying are suppressed, preventing the heat spreader module from being lowered in quality.

The active element is contained in an amount ranging from 50 to 2000 µg/cm$^2$ or more preferably 426.8 to 1358 µg/cm$^2$. Therefore, the absolute amount of the active element necessary to bond the components is sufficiently obtained for a required bonding strength.

In the above manufacturing method, the active element should preferably be Ti. Each of the active hard brazing materials should preferably comprise a hard brazing material containing 3 to 15 weight % of Ti. Specifically, each of the active hard brazing materials should preferably comprise an active hard brazing material of Ag—Cu—In—Ti.

In the above manufacturing method, each of the active hard brazing materials may be stacked as a plate or printed as a paste on a component to be joined, or may be applied as a powder mixed with a binder to a component to be joined.

In the above manufacturing method, an active hard brazing material powder which comprises a mixture of a hard brazing material powder free of an active element and an active element powder, or a paste produced from such an active hard brazing material powder may be used instead of a hard brazing material containing an active element. The hard brazing material free of an active element may comprise a hard brazing material of Ag—Cu—In, and the active element may be Ti.

The heat spreader member should preferably be made of a composite material comprising a matrix of Carbon and/or Graphite Cu impregnated with Cu or Cu alloy or a composite material comprising a matrix of SiC impregnated with Cu or Cu alloy.

The active hard brazing materials may be supplied between the pedestal, the heat spreader member, and the metal plate such that the active hard brazing materials have a thickness ranging from 3 to 20 µm when the active hard brazing materials are melted, and contain the active element in an amount ranging from 426.8 to 1358 μg/cm², and wherein the active hard brazing material may be supplied between the insulating board and the metal plate such that the active hard brazing material has a thickness ranging from 3 to 20 μm when the active hard brazing material is melted, and contains the active element in an amount ranging from 50 to 1000 μg/cm².

According to the present invention, there is also provided a heat spreader module constructed by supplying active hard brazing materials each containing an active element, between a pedestal, a heat spreader member, an insulating board, and a metal plate, and pressing and heating the pedestal, the heat spreader member, the insulating board, and the metal plate to melt the active hard brazing materials, thereby joining the pedestal, the heat spreader member, the insulating board, and the metal plate together, the active hard brazing materials being supplied such that the active hard brazing materials have a thickness ranging from 3 to 20 μm when the active hard brazing materials are melted, the active element being contained in an amount ranging from 50 to 2000 μg/cm², or preferably from 426.8 to 1358 μg/cm².

When the components of the heat spreader module are joined together, no excess active hard brazing materials are produced, and the heat spreader module can have a necessary bonding strength.

According to the present invention, there is also provided a heat spreader module constructed by supplying active hard brazing materials each containing an active element, between a pedestal, a heat spreader member, an insulating board, and a metal plate, and pressing and heating the pedestal, the heat spreader member, the insulating board, and the metal plate to melt the active hard brazing materials, thereby joining the pedestal, the heat spreader member, the insulating board, and the metal plate together. The metal plate includes a marginal edge of alloy having a width within a range of 200 μm. The alloyed region of the metal plate includes constituent elements of the active hard brazing materials.

With the above arrangement, the insulating board and other components that are positioned above and below the metal plate are prevented from cracking. Therefore, the heat spreader module is highly reliable in operation.

The above and other objects, features, and advantages of the present invention will become apparent from the following description with reference to the accompanying drawings which illustrate examples of the present invention.

BRIEF DESCRIPTION OF THE DRAWINGS

FIG. 11 is a diagram showing different squeezed amounts of active hard brazing materials with respect to different thicknesses of the active hard brazing materials when they are supplied, as measured in a third Experimental Example;

FIG. 15 is a diagram showing different bonding strengths with respect to different amounts of Ti between an insulating board of SN and a circuit board of Cu and also between an insulating board of SN and an intermediate layer, as measured in the fifth Experimental Example;

FIG. 17 is a diagram showing bonding strengths, thermal conductivities, squeezed amounts of active hard brazing materials, and alloyed states of intermediate layers of samples 1 through 23, as measured in a seventh Experimental Example.

DESCRIPTION OF THE PREFERRED EMBODIMENTS

A heat spreader module and a method of manufacturing such a heat spreader module will be described below with reference to FIGS. 1 through 17.

Figure 1:
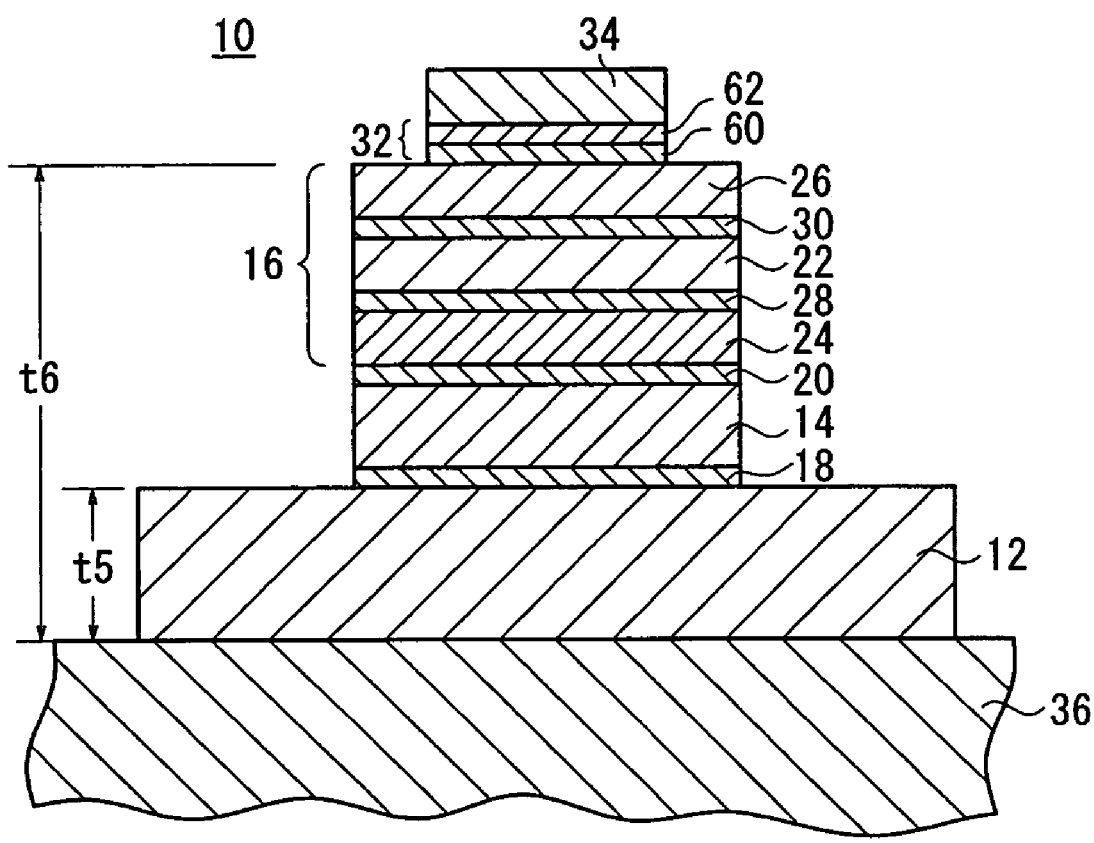
FIG. 1 is a vertical cross-sectional view of a heat spreader module according to an embodiment of the present invention.

As shown in FIG. 1, a heat spreader module according to an embodiment of the present invention comprises a pedestal 12, a heat spreader member 14 disposed above the pedestal 12, a thermally conductive layer 16 disposed on the heat spreader member 14, a first active hard brazing material 18 interposed between the pedestal 12 and the heat spreader member 14, and a second active hard brazing material 20 interposed between the heat spreader member 14 and the thermally conductive layer 16.

The thermally conductive layer 16 comprises an insulating board 22, an intermediate layer 24 interposed between the insulating board 22 and the heat spreader member 14, a circuit board 26 of Cu or Al disposed above the insulating board 22, a third active hard brazing material 28 interposed between the intermediate layer 24 and the insulating board 22, and a fourth active hard brazing material 30 interposed between the insulating board 22 and the circuit board 26.

An IC chip 34 is mounted on a base layer 32 disposed on the circuit board 26. A heat sink 36 made of Al or Cu as a heat radiator is secured by screws (not shown), for example, to the lower surface of the pedestal 12. The insulating board 22 may be made of AlN or $Si_3N_4$.

The order in which the components of the heat spreader module are positioned, i.e., the order of the pedestal 12, the heat spreader member 14, the insulating board 22, the intermediate layer 24, and the circuit board 26, is not limited to the order shown in FIG. 1. Insofar as the pedestal 12 is positioned adjacent to the heat sink 36 and the circuit board 26 is positioned adjacent to the IC chip 34 with the base layer 32 interposed therebetween, each of the intermediate layer 24 and the heat spreader member 14 may not be a single layer, but may be a combination of layers, and the insulating board 22 may not be disposed directly below the circuit board 26, but may be disposed in any suitable position anywhere between the pedestal 12 and the circuit board 26.

The thermal conductivity of the heat spreader member 14 should preferably be 150 W/mK or higher. If the thermal conductivity of the heat spreader member 14 is lower than 150 W/mK, then the heat generated by the IC chip 34 during operation of the heat spreader module 10 is transferred out of the heat spreader module 10 at a lower speed, resulting in a poorer ability to keep the heat spreader module 10 at a constant temperature.

The heat spreader member 14 is made of any material or materials as long as its thermal conductivity or coefficient of thermal expansion falls in the above range. Preferably, the heat spreader member 14 should be made of at least one material selected from the group consisting of SiC, AlN, $Si_3N_4$, BeO, $Al_2O_3$, $Be_2C$, C, Cu, Cu alloy, Al, Al alloy, Ag, Ag alloy, and Si. That is, the heat spreader member 14 may be made of a single material selected from the above group or a composite material comprising at least two materials selected from the above group. For example, such a composite material may be a SiC/Cu composite material 40 (see FIG. 2) or a C/Cu composite material 42 (see FIG. 3).

Figure 2:
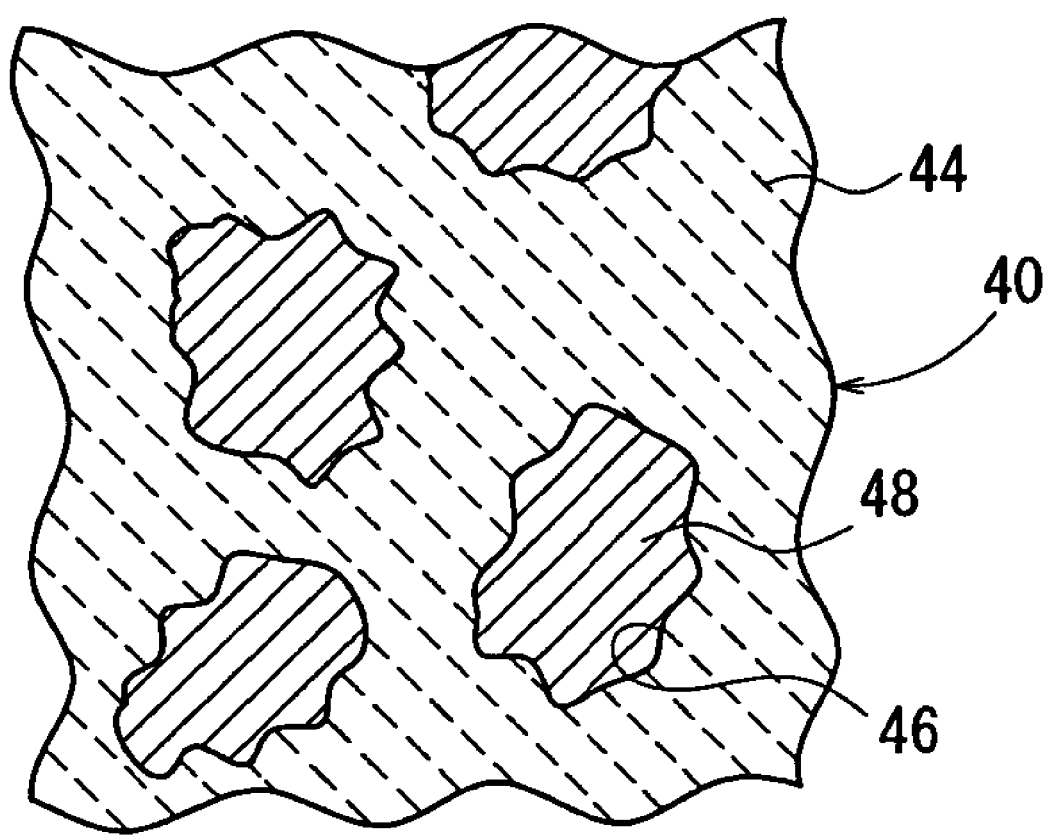
FIG. 2 is an enlarged fragmentary view showing an SiC/Cu composite material as an example of a heat spreader member.

As shown in FIG. 2, the SiC/Cu composite material 40 comprises a porous sintered body 44 of Sic having open pores 46 impregnated with melted Cu or Cu alloy 48, which is subsequently solidified.

Figure 3:
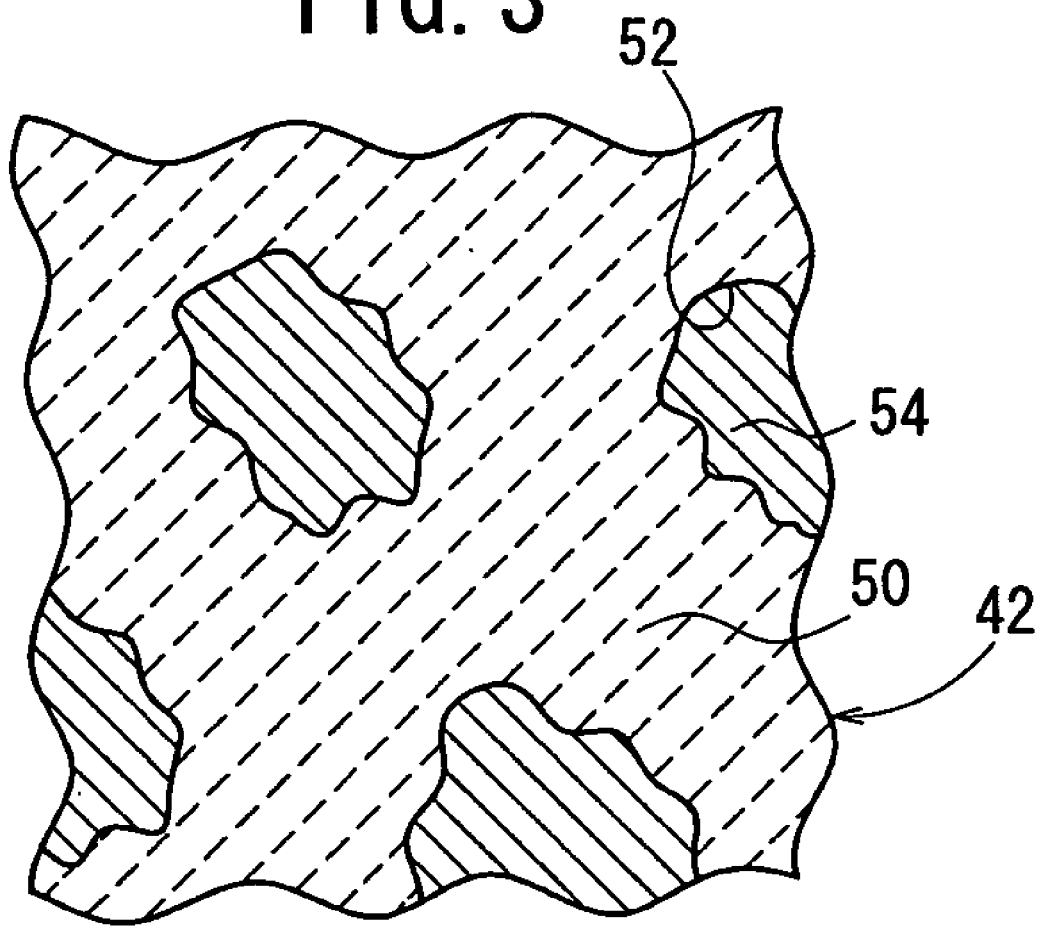
FIG. 3 is an enlarged fragmentary view showing a C/Cu composite material as another example of a heat spreader member.

As shown in FIG. 3, the C/Cu composite material 42 comprises a porous sintered body 50 which is produced by preliminarily sintering carbon or an isotope thereof into a network, the porous sintered body 50 having open pores 52 impregnated with melted Cu or Cu alloy 54, which is subsequently solidified. The C/Cu composite material 42 is disclosed in Japanese laid-open patent publication No. 2001-339022, for example.

If the heat spreader member 14 is made of any of composite materials or alloys referred to above, the coefficient of thermal expansion and the thermal conductivity thereof can be controlled at a range from $3.0 \times 10^{-6}$ to $1.0 \times 10^{-5}$/K and at least 150 W/mK, respectively, by setting a composition ratio of the constituents.

The first through fourth active hard brazing materials 18, 20, 28, 30 should preferably be an active hard brazing material containing an active element or elements. The active element or elements may be at least one of elements belonging to the periodic table, group 2A (IIA, 2), such as Mg, Sr, Ca, Ba, Be, etc., group 3A (IIIB, 3), such as Ce, etc., group 4A (IVB, 4), such as Ti, Zr, etc., group 5A (VB, 5), such as Nb, etc., group 3B (IIIA, 13), such as B, etc., or group 4B (IVA, 14), such as Si, etc. In the present embodiment, the first through fourth active hard brazing materials 18, 20, 28, 30 comprise a hard brazing material of Ag—Cu—In—Ti where Ti is an active element.

As shown in FIG. 1, the base layer 32 comprises a solder layer 60 disposed on the thermally conductive layer 16 and an Ni layer 62 disposed on the solder layer 60 for increasing the wettability of the IC chip 34 with respect to the solder layer 60. The pedestal 12 is made of pure copper or copper alloy.

A process of manufacturing the heat spreader module 10 according to the present embodiment will be described below with reference to FIGS. 4A through 5.

Figure 4A:
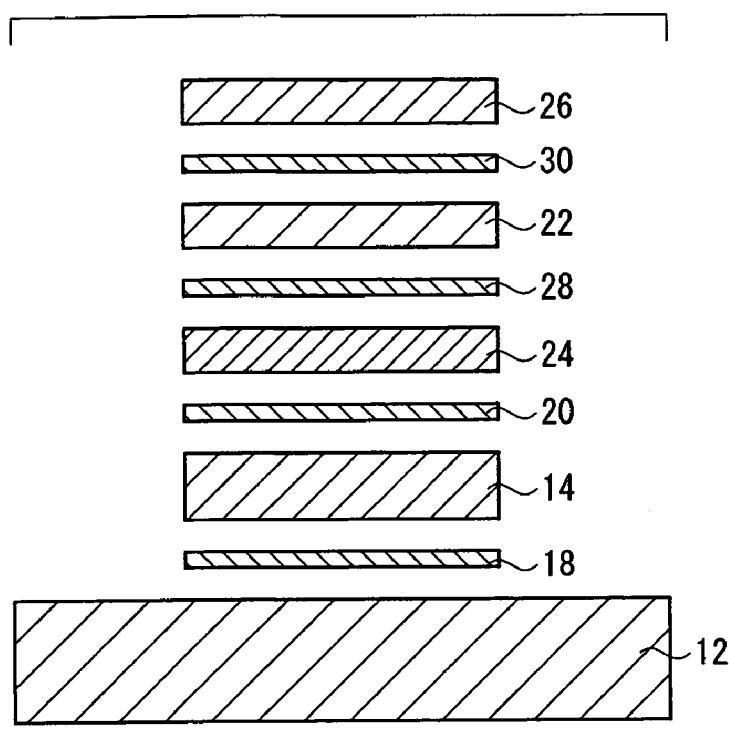
FIG. 4A is a vertical cross-sectional view illustrative of a setting step.

FIG. 4A illustrates a setting step. In the setting step, the first active hard brazing material 18 in the form of a plate, the heat spreader member 14, the second active hard brazing material 20 in the form of a plate, the intermediate layer 24, the third active hard brazing material 28 in the form of a plate, the insulating board 22, the fourth active hard brazing material 30 in the form of a plate, and the circuit board 26 are placed on the pedestal 12 successively in the order named. The setting step is performed in the atmosphere, for example.

Figure 4B:
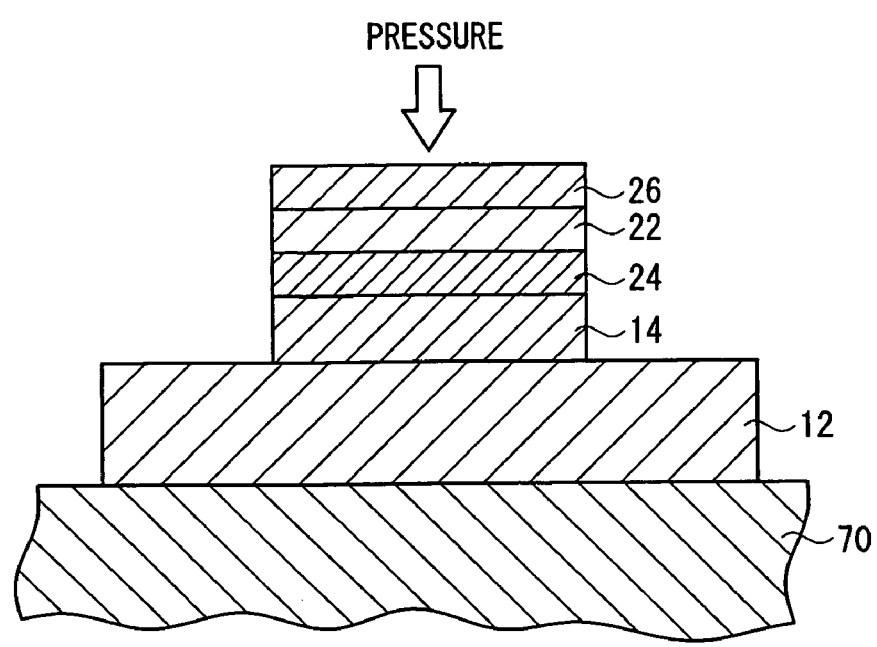
FIG. 4B is a vertical cross-sectional view illustrative of a joining step.

FIG. 4B illustrates a joining step. In the joining step, the pedestal 12, on which the first active hard brazing material 18, the heat spreader member 14, the second active hard brazing material 20, the intermediate layer 24, the third active hard brazing material 28, the insulating board 22, the fourth active hard brazing material 30, and the circuit board 26 are set, is fixedly mounted on a jig 70. The assembly is placed in a vacuum of $1.0 \times 10^{-5}$ Torr or lower, and is pressed from above to join the components together while the temperature is being raised and lowered. The joining step thus performed produces an integrally joined assembly of the circuit board 26, the insulating board 22, the intermediate layer 24, the heat spreader member 14, and the pedestal 12, i.e., the heat spreader module 10, as shown in FIG. 1.

In FIG. 4A, the first through fourth active hard brazing materials 18, 20, 28, 30 each in the form of a plate are employed. However, as shown in FIG. 5, the first through fourth active hard brazing materials 18, 20, 28, 30 may be employed each in the form of a paste. Specifically, the heat spreader member 14 that is coated with the second active hard brazing material 20 is placed on the pedestal 12 that is coated with the first active hard brazing material 18, and the intermediate layer 24 that is coated with the third active hard brazing material 28 is placed on the heat spreader member 14.

Then, the insulating board 22 that is coated with the fourth active hard brazing material 30 is placed on the intermediate layer 24, and the circuit board 26 is placed on the insulating board 22. The setting step wherein the first through fourth active hard brazing materials 18, 20, 28, 30 each in the form of a paste are applied is now completed.

In the joining step shown in FIG. 4B, the assembly should preferably be pressed under a pressure in the range from 0.2 MPa to 10 MPa.

Figure 5:
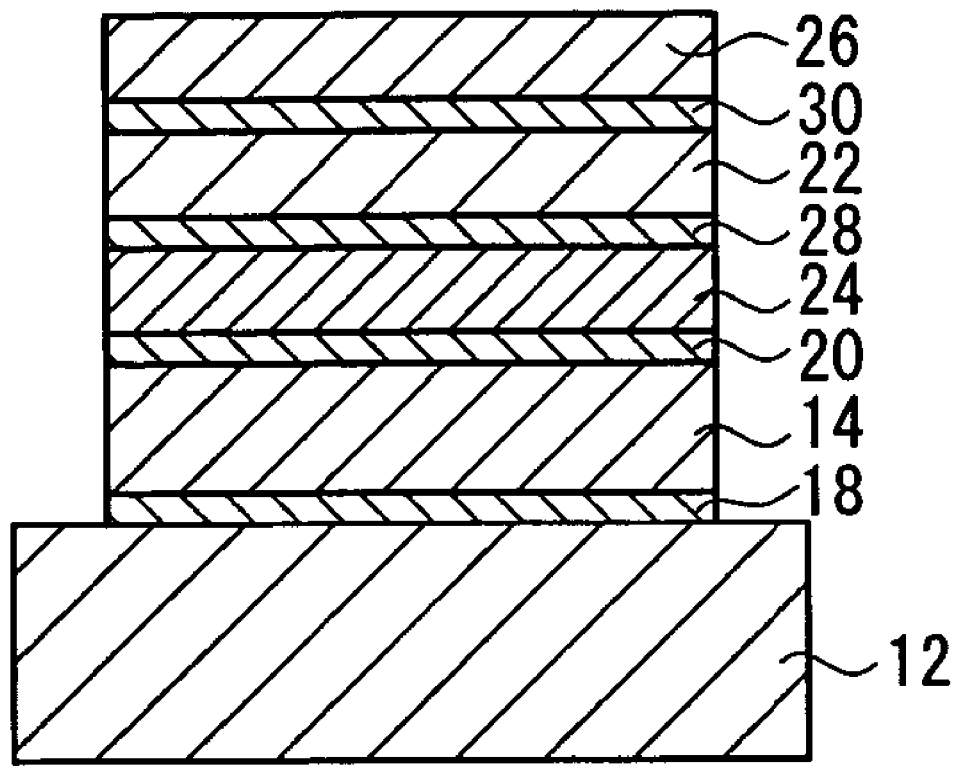
FIG. 5 is a vertical cross-sectional view illustrative of another joining step.

According to the present embodiment, in the setting step shown in FIG. 4A or 5, the first through fourth active hard brazing materials 18, 20, 28, 30 are supplied in such quantities that when they are melted under pressure and heat so as to be joined together, they have an average thickness in the range from 3 to 20 μm.

The amount of Ti contained in each of the first through fourth active hard brazing materials 18, 20, 28, 30 should preferably be in the range from 50 to 2000 μg/cm² or more preferably be in the range from 426.8 to 1358 μg/cm².

Since the first through fourth active hard brazing materials 18, 20, 28, 30 are supplied such that their average thickness is in the range from 3 to 20 μm at the time they are melted under pressure and heat so as to be joined together, when the pedestal 12, the heat spreader member 14, the intermediate layer 24, the insulating board 22, and the circuit board 26 are joined together under pressure, any amount of active hard brazing material 80 (see FIG. 7A, for example) that is squeezed out is essentially eliminated or greatly reduced. Therefore, the step of removing the squeezed-out active hard brazing material 80 may be dispensed with, and the manufacturing cost of the heat spreader module 10 may be lowered. In addition, alloying of the surface of the intermediate layer 24 which is in the form of a metal plate is suppressed, so that the quality of the heat spreader module 10 will not be reduced. The circuit board 26 is often in the form of a thin plate having a thickness ranging from 0.1 to 0.3 mm. Therefore, any squeezed-out active hard brazing material 80 that is applied to the side edges of the circuit board 26 is extremely small, and hence the active hard brazing material 80 and the circuit board 26 are essentially not alloyed.

The bonding strength between the components depends on the amount of Ti contained in each of the first through fourth active hard brazing materials 18, 20, 28, 30. In the present embodiment, inasmuch as the amount of Ti contained in each of the first through fourth active hard brazing materials 18, 20, 28, 30 is preferably in the range from 50 to 2000 μg/cm² or more preferably in the range from 426.8 to 1358 μg/cm², the absolute amount of Ti necessary to bond the components is sufficiently obtained for a required bonding strength.

Figure 6:
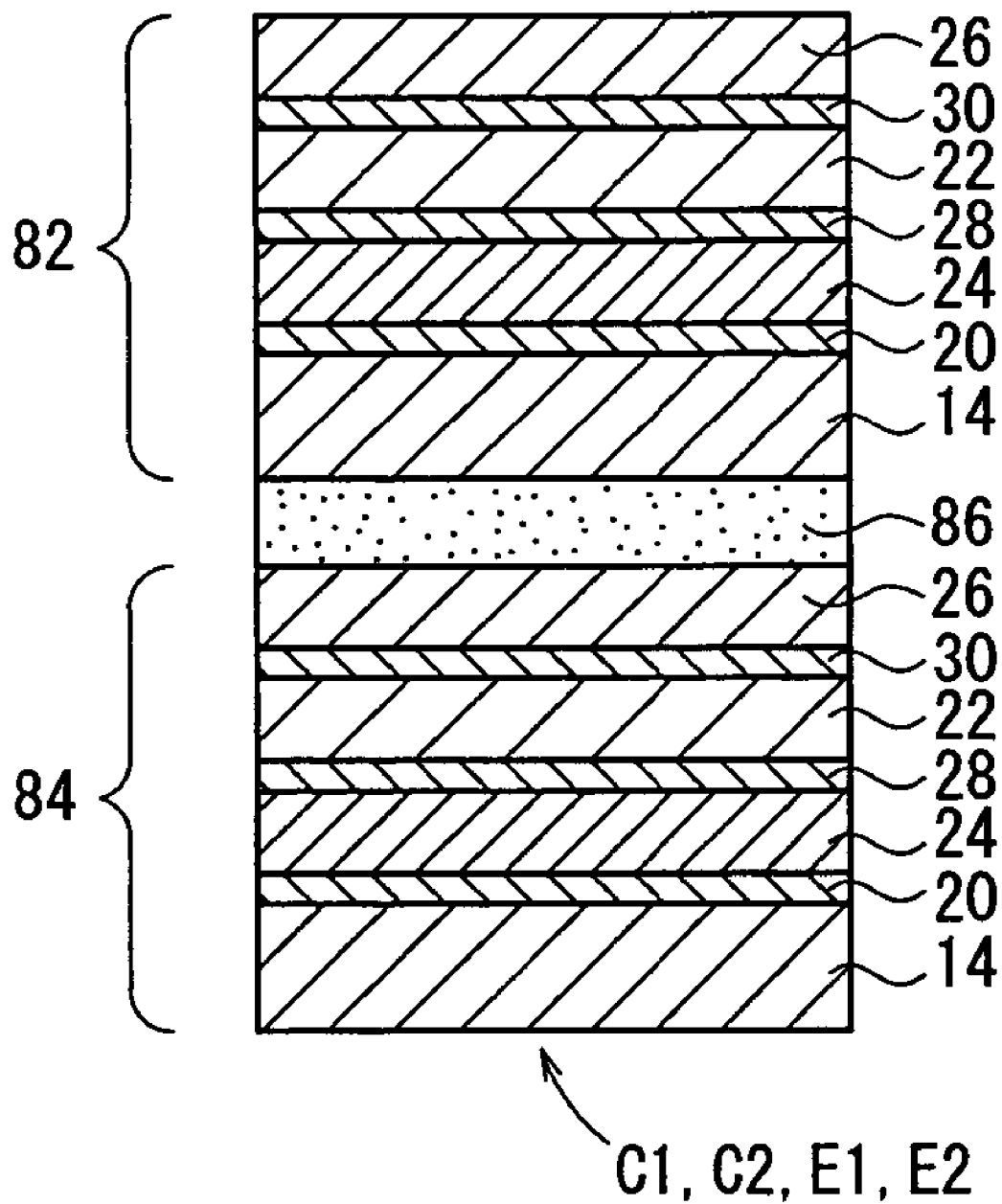
FIG. 6 is a cross-sectional view of a sample used in first through third Experimental Examples.

Seven Experimental Examples will be described below. In the first Experimental Example, squeezed-out states of the active hard brazing material 80 are observed for appearance with respect to several samples (Comparative Examples C1, C2 and Inventive Examples E1, E2). As shown in FIG. 6, these samples have such a common structure that two joined assemblies 82, 84 are stacked with a buffer layer 86 interposed therebetween. Each of the joined assemblies 82, 84 is constructed of the heat spreader member 14 (having a thickness of 3.0 mm) made of the C/Cu composite material 42 (see FIG. 3), the second active hard brazing material 20 placed on the heat spreader member 14, the intermediate layer 24 (having a thickness of 0.25 mm) made of Cu which is placed on the second active hard brazing material 20, the third active hard brazing material 28 placed on the intermediate layer 24, the insulating board 22 (having a thickness of 0.3 mm) of SN which is placed on the third active hard brazing material 28, the fourth active hard brazing material 30 placed on the insulating board 22, and the circuit board 26 (having a thickness of 0.3 mm) of Cu which is placed on the fourth active hard brazing material 30.

The samples were placed in a vacuum of $1.0 \times 10^{-5}$ Torr or lower at a temperature of 830° C., and were pressed under a pressure of 3.5 MPa to join the components together. The samples were pressed for 10 minutes.

In Comparative Example C1, each of the second through fourth active hard brazing materials 20, 28, 30 had a thickness of 50 μm at the time the components were joined under pressure. In Comparative Example C2, each of the second through fourth active hard brazing materials 20, 28, 30 had a thickness of 30 μm at the time the components were joined under pressure. In Inventive Example E1, each of the second through fourth active hard brazing materials 20, 28, 30 had a thickness of 20 μm at the time the components were joined under pressure. In Inventive Example E2, each of the second through fourth active hard brazing materials 20, 28, 30 had a thickness of 10 μm at the time the components were joined under pressure.

Figure 7A:
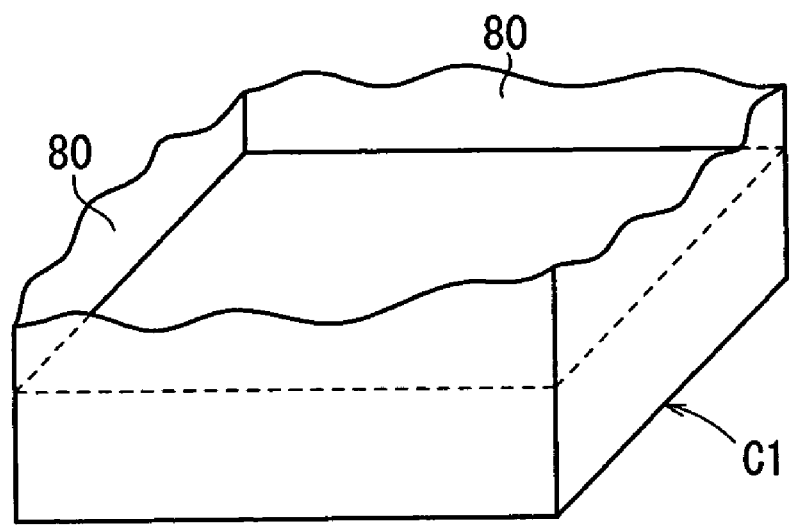
FIG. 7A is a perspective view showing an appearance of Comparative Example C1 after its components are joined under pressure.
Figure 7B:
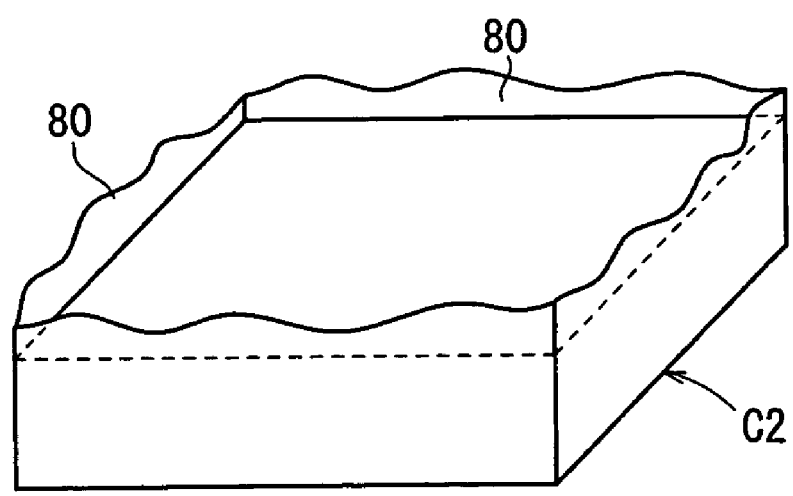
FIG. 7B is a perspective view showing an appearance of Comparative Example C2 after its components are joined under pressure.

The appearances of the samples after the experimentation are shown in FIGS. 7A through 8B. In Comparative Example C1, as shown in FIG. 7A, it can be seen a large amount of excess active hard brazing material 80 was squeezed out when the components were pressed, with a large amount of active hard brazing material 80 applied to the side edges of the circuit board 26 and the intermediate layer 24. In Comparative Example C2, as shown in FIG. 7B, it can be seen some excess active hard brazing material 80 was squeezed out when the components were pressed, with active hard brazing material 80 applied to the side edges of the circuit board 26 and the intermediate layer 24.

Figure 8A:
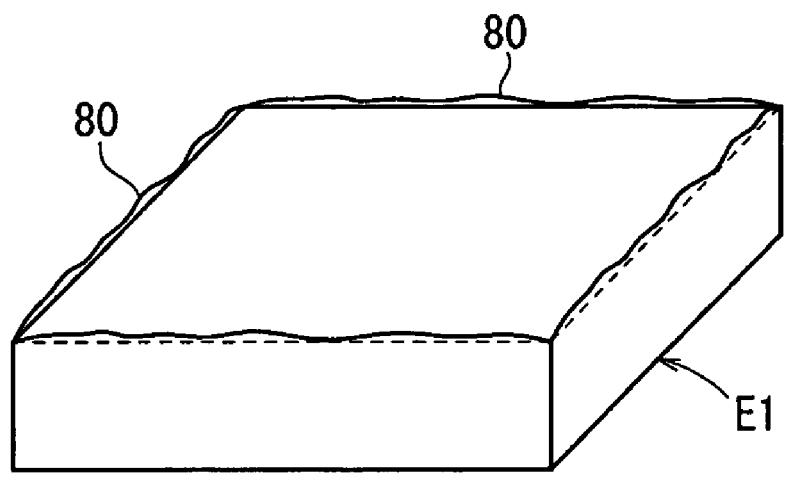
FIG. 8A is a perspective view showing an appearance of Inventive Example E1 after its components are joined under pressure.
Figure 8B:
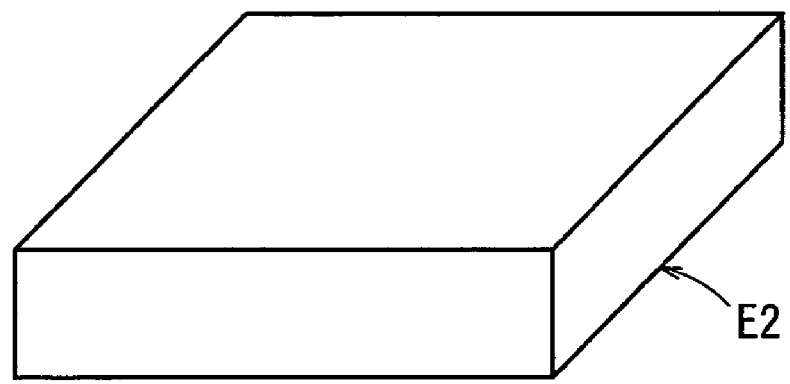
FIG. 8B is a perspective view showing an appearance of Inventive Example E2 after its components are joined under pressure.

In Inventive Example E1, as shown in FIG. 8A, the amount of excess active hard brazing material 80 that was squeezed out when the components were pressed is small, with almost no active hard brazing material 80 applied to the side edges of the circuit board 26 and the intermediate layer 24. In Inventive Example E2, as shown in FIG. 8B, no active hard brazing material 80 was squeezed out when the components were pressed is small, with no active hard brazing material 80 applied to the side edges of the circuit board 26 and the intermediate layer 24.

In the second Experimental Example, Comparative Examples C1, C2 and Inventive Examples E1, E2 that were experimented were broken vertically, and the intermediate layers 24 were observed about how they were alloyed and the insulating boards 22 were observed about how they cracked. The experimental results are shown in FIGS. 9A through 10B.

Figure 9A:
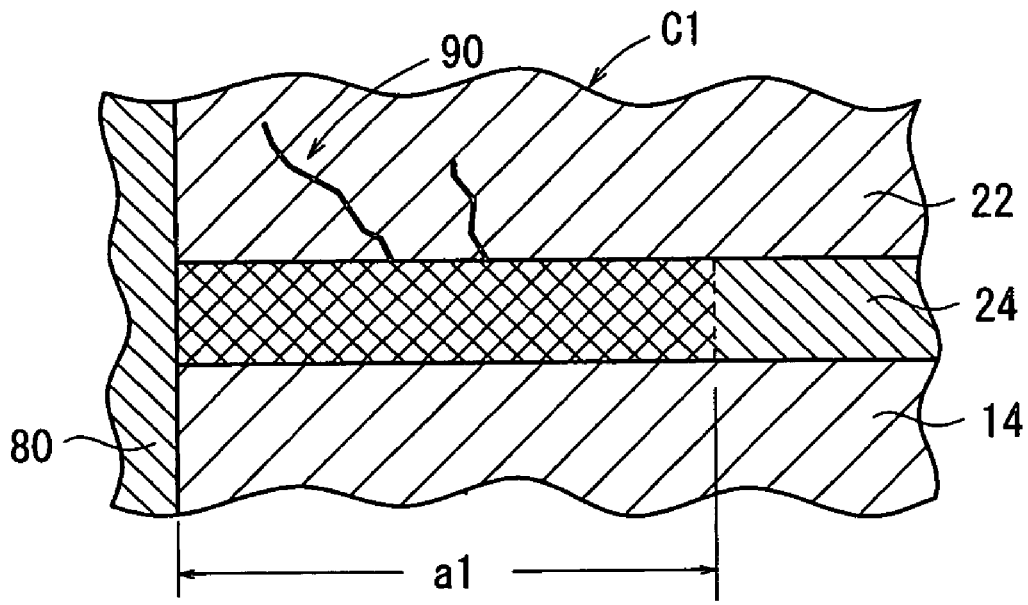
FIG. 9A is a cross-sectional view showing an alloyed state of an intermediate layer in Comparative Example C1 after its components are joined under pressure.
Figure 9B:
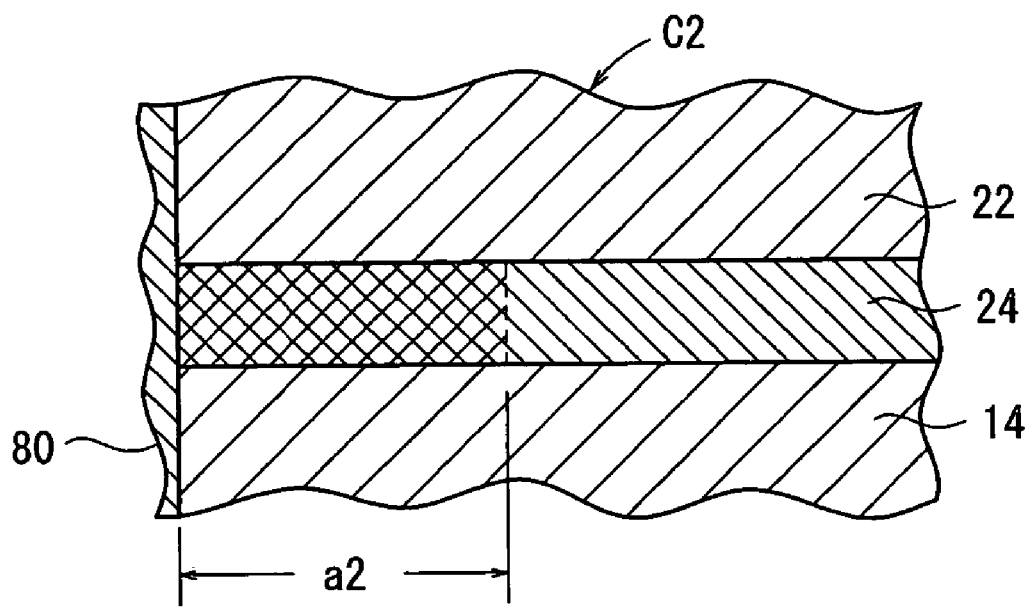
FIG. 9B is a cross-sectional view showing an alloyed state of an intermediate layer in Comparative Example C2 after its components are joined under pressure.

In Comparative Example C1, as shown in FIG. 9A, the intermediate layer 24 was alloyed by a depth of about 200 μm from its side edge toward the center thereof (see an alloyed range a1). In Comparative Example C2, as shown in FIG. 9B, the intermediate layer 24 was alloyed by a depth of about 100 μm from its side edge toward the center thereof (see an alloyed range a2). In Comparative Example C1, since the alloyed range was large, the insulating board 22 had cracks 90 therein.

Figure 10A:
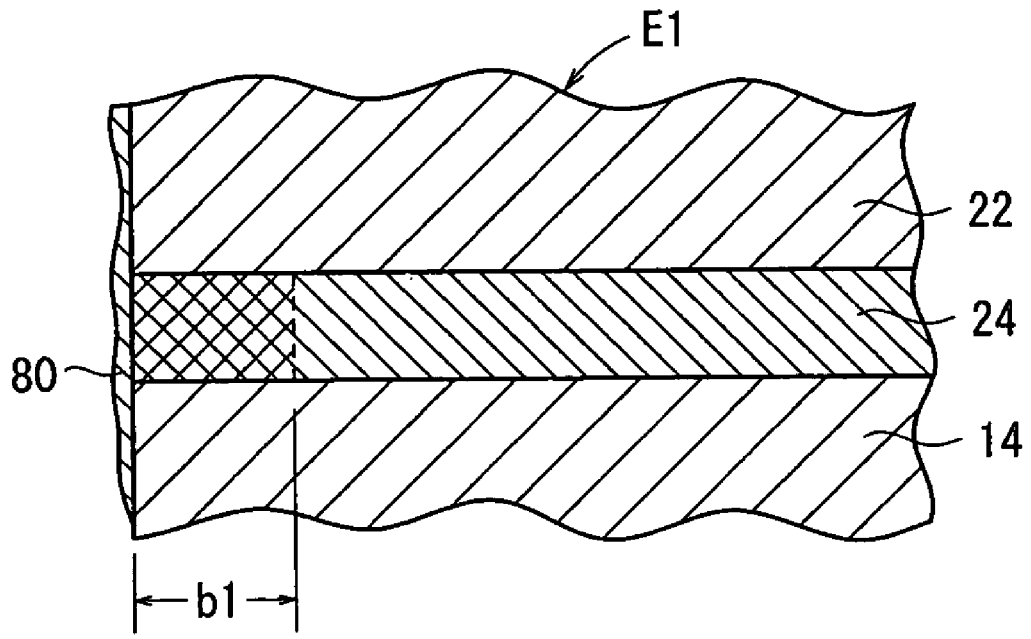
FIG. 10A is a cross-sectional view showing an alloyed state of an intermediate layer in Inventive Example E1 after its components are joined under pressure.
Figure 10B:
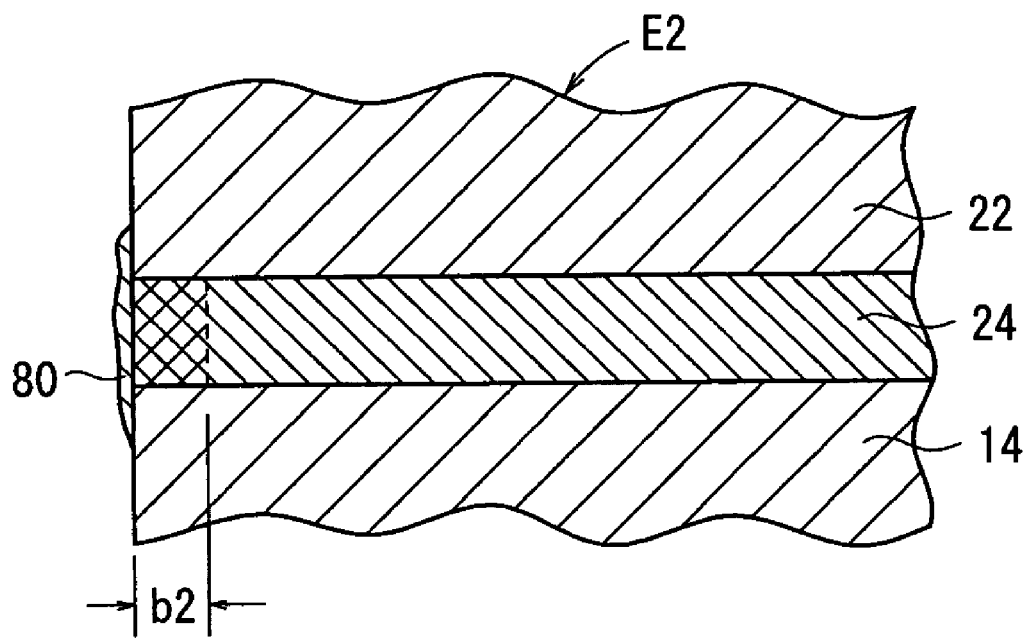
FIG. 10B is a cross-sectional view showing an alloyed state of an intermediate layer in Inventive Example E2 after its components are joined under pressure.

In Inventive Example E1, as shown in FIG. 10A, the intermediate layer 24 was alloyed by a depth of about 20 μm from its side edge toward the center thereof (see an alloyed range b1). The alloyed range b1 is much smaller than those in Comparative Examples C1, C2. In Inventive Example E2, as shown in FIG. 10B, the intermediate layer 24 was alloyed by a depth of about 10 μm from its side edge toward the center thereof (see an alloyed range b2). It will be understood that the intermediate layer 24 in Inventive Example E2 was almost not alloyed.

In the third Experimental Example, the samples (see FIG. 6) which are the same as those in the first Experimental Example were measured for different amounts of squeezed-out active hard brazing material 80 with respect to different thicknesses of the second through fourth active hard brazing materials 20, 28, 30 at the time they were supplied. The different amounts of squeezed-out active hard brazing material 80 were measured by cutting off the squeezed-out active hard brazing material 80 and measuring the weight thereof.

The measured results are shown in FIG. 11. In FIG. 11, plots indicated by ◇ (:Empty Diamond) represent amounts of squeezed-out active hard brazing material 80 when a active hard brazing material containing 2.2 weight % of Ti was used as the second through fourth active hard brazing materials 20, 28, 30, and plots indicated by ■ (:Filled Square) represent amounts of squeezed-out active hard brazing material 80 when an active hard brazing material containing 7 weight % of Ti was. used as the second through fourth active hard brazing materials 20, 28, 30. A straight-line curve G which is inclined upwardly to the right represents changes in the total weight of the second through fourth active hard brazing materials 20, 28, 30 when they were supplied.

As shown in FIG. 11, the amount of squeezed-out active hard brazing material 80 increases as the thicknesses of the supplied second through fourth active hard brazing materials 20, 28, 30 increase. It can also be seen that the difference between the amount of squeezed-out active hard brazing material 80 and the total weight of the second through fourth active hard brazing materials 20, 28, 30 when they were supplied, i.e., the amount of active hard brazing material 80 that contributed to the joining of the components, remains substantially unchanged.

Consequently, it can be understood from the third Experimental Example that since the weight of active hard brazing material 80 that contributed to the joining of the components remains substantially unchanged, it is useless to supply an amount of active hard brazing material in excess of that weight, and if an amount of active hard brazing material in excess of that weight is supplied, then the intermediate layer 24 will undesirably be alloyed, resulting in characteristic degradations.

The fourth Experimental Example will be described below. In the fourth Experimental Example, different bonding strengths of the heat spreader module with respect to the amounts of Ti contained in the second through fourth active hard brazing materials 20, 28, 30 were observed.

In the fourth Experimental Example, there were prepared samples wherein 59.8Ag-24Cu-14In-2.2Ti ("2.2Ti material") was employed as the first through fourth active hard brazing materials 18, 20, 28, 30 and the samples had respective thicknesses of 5 μm, 7.5 μm, 10 μm, 15 μm, and 20 μm when they were supplied, and samples wherein 58Ag-22Cu-13In-7Ti ("7Ti material") was employed as the first through fourth active hard brazing materials 18, 20, 28, 30 and the samples had respective thicknesses of 5 μm, 7.5 μm, 10 μm, 15 μm, and 20 μm when they were supplied.

Figure 12:
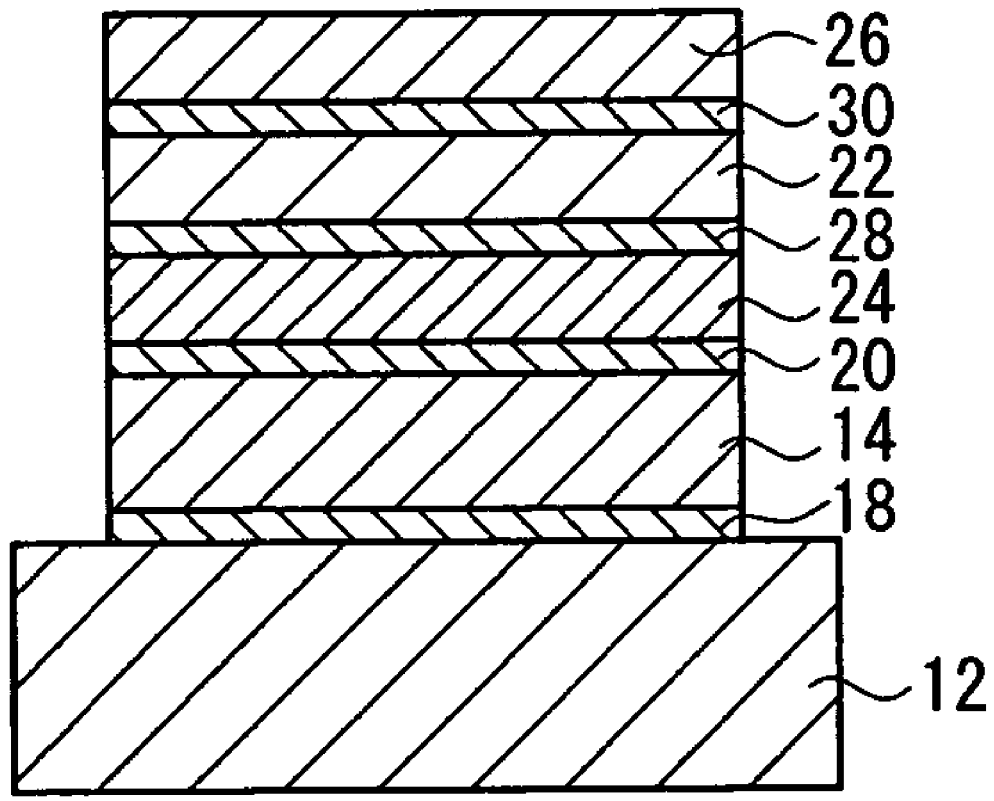
FIG. 12 is a cross-sectional view of a sample used in fourth through sixth Experimental Examples.

As shown in FIG. 12, each of the samples of the 2.2Ti material and the 7Ti material is constructed of the first active hard brazing material 18 that is placed on the pedestal 12 (having a thickness of 2.0 mm) made of Cu, the heat spreader member 14 (having a thickness of 3.0 mm) made of the C/Cu composite material which is placed on the first active hard brazing material 18, the second active hard brazing material 20 placed on the heat spreader member 14, the intermediate layer 24 (having a thickness of 1.0 mm) placed on the second active hard brazing material 20, the third active hard brazing material 28 placed on the intermediate layer 24, the insulating board 22 (having a thickness of 0.3 mm) of SN which is placed on the third active hard brazing material 28, the fourth active hard brazing material 30 placed on the insulating board 22, and the circuit board 26 (having a thickness of 0.2 mm) of Cu which is placed on the fourth active hard brazing material 30.

The samples of the 2.2Ti material and the 7Ti material were subjected to a peel test in which terminals were joined to the pedestal 12 and the circuit board 26 and the samples were simply pulled vertically. In the peel test, the samples were measured for a strength at the time the joined surfaces (active hard brazing material surfaces) were peeled off or a strength at the time the heat spreader member 14 was fractured. If the joined surfaces are peeled off, then it means that the bonding strength is too low, and if the heat spreader member 14 is fractured, then it means that the bonding strength is high and the joined surfaces are highly reliable.

Figure 13:
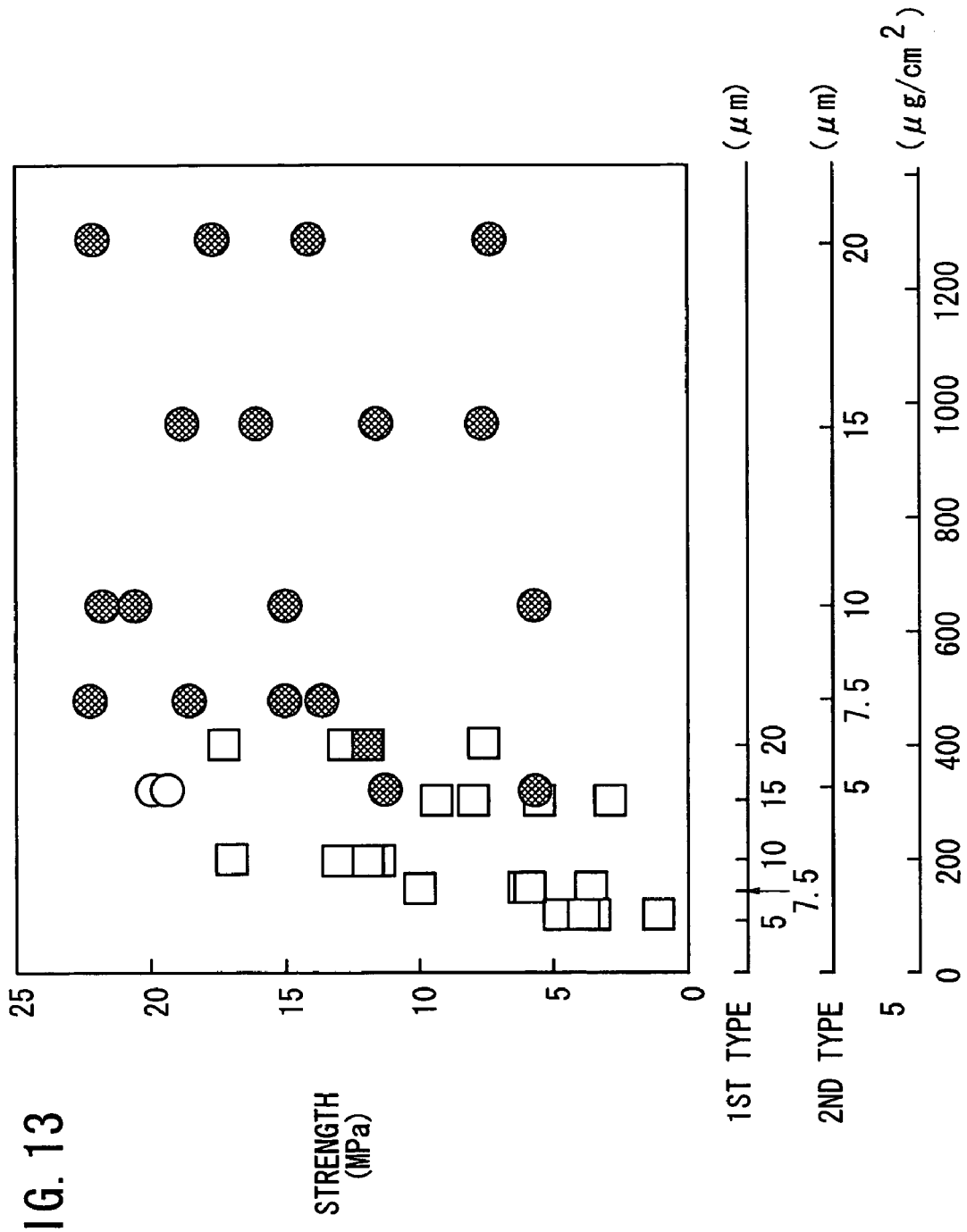
FIG. 13 is a diagram showing different bonding strengths of heat spreader modules with respect to different amounts of Ti contained in active hard brazing materials, as measured in the fourth Experimental Example.

The measured results of the fourth Experimental Example are shown in FIG. 13. In FIG. 13, the horizontal axis represents graduations for the thicknesses of the active hard brazing materials 18, 20, 28, 30 of the samples of the 2.2Ti material, graduations for the thicknesses of the active hard brazing materials 18, 20, 28, 30 of the samples of the 7Ti material, and graduations for amounts of contained Ti.

In FIG. 13, plots indicated by □ (:Empty Square) represent strengths at the time the joined surfaces of the samples of the 2.2Ti material were peeled off, and plots indicated by ■ (:Filled Square) represent strengths at the time the heat spreader member 14 of the samples of the 2.2Ti material were fractured. Similarly, plots indicated by ○ (:Empty Circle) represent strengths at the time the joined surfaces of the samples of the 7Ti material were peeled off, and plots indicated by ● (:Filled Circle) represent strengths at the time the heat spreader member 14 of the samples of the 7Ti material were fractured. The peeling off of each of the joined surfaces took place at the interface between the heat spreader member 14 and the pedestal 12 or the interface between the heat spreader member 14 and the intermediate layer 24.

It can be seen from the experimental results shown in FIG. 13 that with respect to the samples of the 2.2Ti material, the joined surfaces were peeled off in all the thicknesses ranging from 5 to 20 μm, and the heat spreader member 14 was also fractured in the sample having the thickness of 20 μm.

It can also be seen that with respect to the samples of the 7Ti material, the joined surfaces were peeled off in the sample having the thickness of 5 μm, and that sample had a bonding strength of 20 MPa which is of a practical level, and the heat spreader member 14 was fractured, but the joined surfaces were not peeled off, in all the samples having the thicknesses ranging from 7.5 to 20 μm.

Of the samples of the 2.2Ti material, the sample having the thickness of 20 μm contained about 420 μg/cm$^2$ of Ti. Of the samples of the 7Ti material the sample having the thickness of 5 μm contained about 350 μg/cm$^2$ of Ti. It can thus be seen that if the amount of contained Ti required to join the heat spreader member 14 and the pedestal 12 to each other and also to join the heat spreader member 14 and the intermediate layer 24 is 400 μg/cm$^2$ or greater, then the bonding strength that is achieved is of a practical level.

Figure 14:
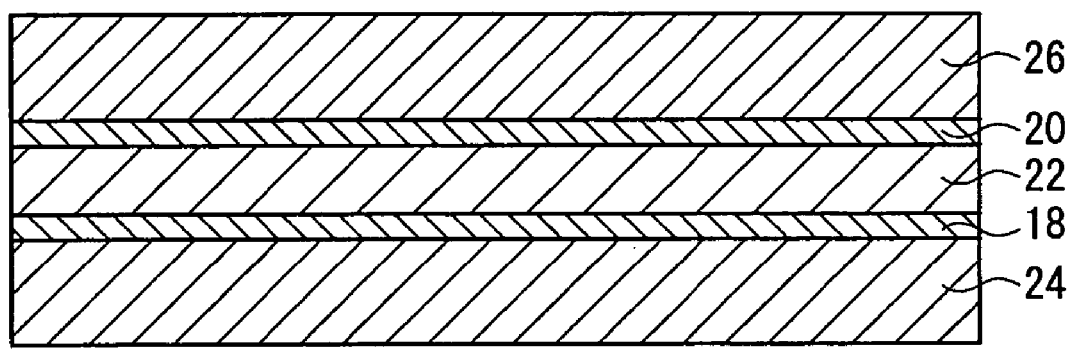
FIG. 14 is a cross-sectional view of a sample used in the fifth Experimental Example.

The fifth Experimental Example will be described below. The fifth Experimental Example employed samples of 60Ag-24.7Cu-14In-13Ti ("1.3Ti material") and samples of the 2.2Ti material. Each of the samples of the third and fourth types is constructed of, as shown in FIG. 14, the first active hard brazing material 18 that is placed on the intermediate layer 24 (having a thickness of 1.0 mm) made of Cu, the insulating board 22 (having a thickness of 0.3 mm) of SN which is placed on the first active hard brazing material 18, the fourth active hard brazing material 30 that is placed on the insulating board 22, and the circuit board 26 (having a thickness of 0.2 mm) of Cu which is placed on the second active hard brazing material 20.

In the fifth Experimental Example, the samples were observed for different bonding strengths with respect to different amounts of Ti required to join the insulating board 22 of SN and the circuit board 26 of Cu to each other and also to join the insulating board 22 of SN and the intermediate layer 24 to each other.

The measured results are shown in FIG. 15. In the fifth Experimental Example, the samples of the first and second types were subjected to a peel test in which terminals were joined to the intermediate layer 24 and the circuit board 26 and the samples were simply pulled vertically. Those samples which had joined surfaces peeled off were judged as being rejected (NG), and those samples which had the insulating board 22 itself fractured were judged as being acceptable (OK) because the bonding strength was regarded as being of a practical level.

It can be seen from the results shown in FIG. 15 that with respect to the samples of the 1.3Ti material, the joined surfaces were peeled off in the sample having the thickness of 3 μm, and the insulating board 22 was fractured in those samples having the thicknesses ranging from 5 to 20 μm.

It can also be seen from the results shown in FIG. 15 that with respect to the samples of the 2.2Ti material, the insulating board 22 was fractured in all those samples having the thicknesses ranging from 3 to 20 μm.

Of the samples of the 1.3Ti material, the sample having the thickness of 3 μm contained about 38 μg/cm$^2$ of Ti, and the sample having the thickness of 5 μm contained about 63 μg/cm$^2$ of Ti. It can thus be seen that if the amount of contained Ti required to join the insulating board 22 of SN and the circuit board 26 of Cu to each other and also to join the insulating board 22 of SN and the intermediate layer 24 to each other is 50 μg/cm$^2$ or greater, then the bonding strength that is achieved is of a practical level.

The sixth Experimental Example will be described below. In the sixth Experimental Example, different thermal conductivities of heat spreader modules 10 with respect to different amounts of Ti contained in the first through fourth active hard brazing materials 18, 20, 28, 30 were observed. Specifically, the samples of the 2.2Ti material and the 7Ti material in the fourth Experimental Example were measured for thermal conductivities.

Figure 16:
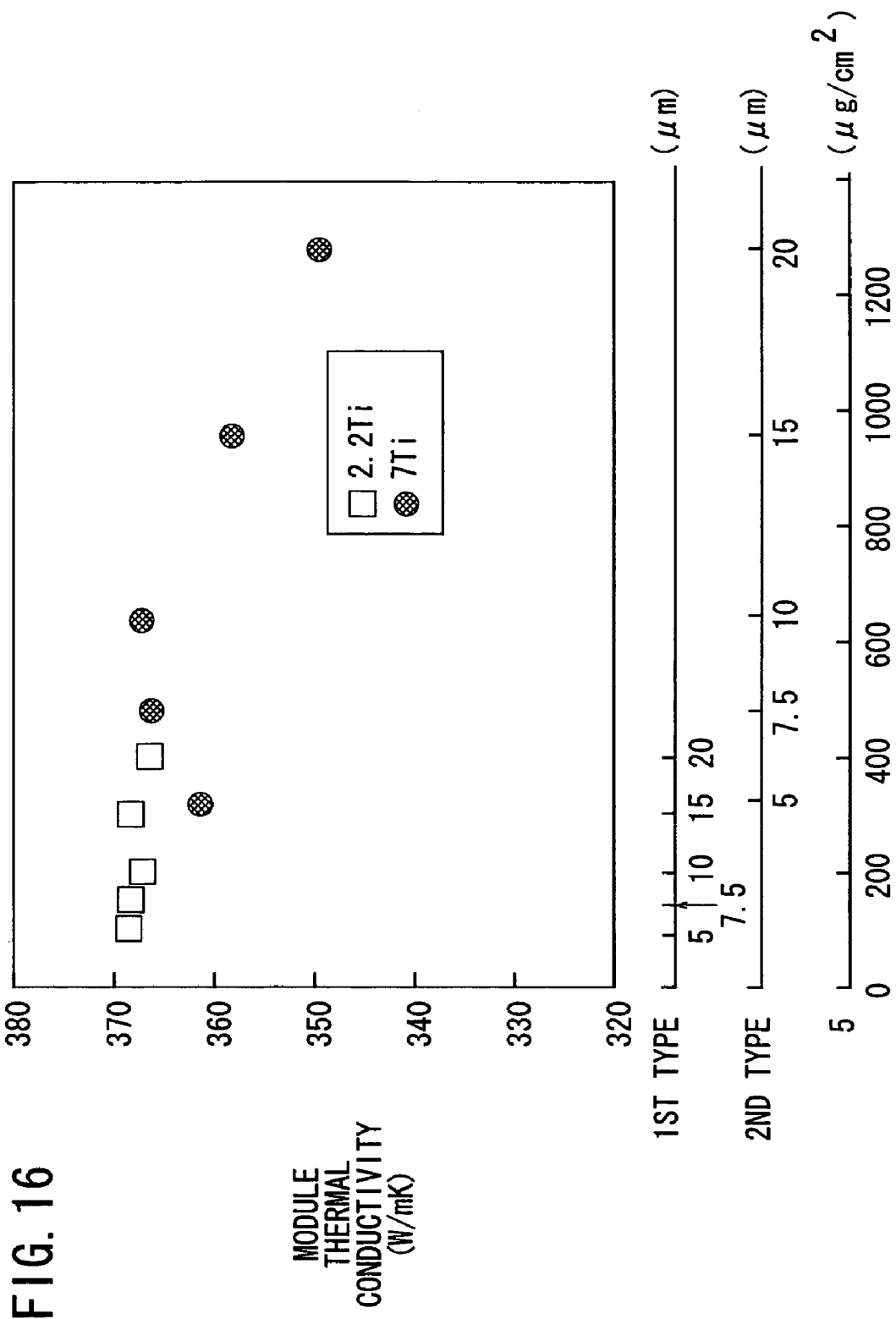
FIG. 16 is a diagram showing different thermal conductivities of heat spreader modules with respect to different amounts of Ti contained in active hard brazing materials, as measured in the sixth Experimental Example.

The measured results are illustrated in FIG. 16. In FIG. 16, plots indicated by □ (:Empty Square) represent thermal conductivities of the samples of the 2.2Ti material, and plots indicated by ● (:Filled Circle) represent thermal conductivities of the samples of the 7Ti material.

All the samples of the 2.2Ti material, and those samples of the 7Ti material in which the first through fourth active hard brazing materials 18, 20, 28, 30 had respective thicknesses of 5 μm, 7.5 μm, 10 μm, and 15 μm when they were supplied had thermal conductivities of 350 W/mK or higher. However, those samples of the 7Ti In material in which the first through fourth active hard brazing materials 18, 20, 28, 30 had respective thicknesses of 20 μm (which can be converted into 1300 μg/cm$^2$ as the amount of contained Ti) when they were supplied had thermal conductivities less than 350 W/mK.

It can be understood from FIG. 16 that if the amount of contained Ti is 1200 μg/cm$^2$ or less, then the thermal conductivity that is achieved is of a practical level.

The seventh Experimental Example will be described below. The seventh Experimental Example serves as a general experiment, and was conducted to observe bonding strengths, thermal conductivities, squeezed amounts of active hard brazing material 80, and alloyed states of the intermediate layer 24 of samples 1 through 23 (having the same structural details as shown in FIG. 12) that were joined under the joining conditions described below.

Alloyed states were judged as "x" if the applied amount of brazing material was in excess of 20 μm and the intermediate layer 24 was alloyed by a depth of 200 μm or greater from its side edge toward the center thereof, "○" if the applied amount of brazing material was in the range from 10 to 20 μm and the intermediate layer 24 was free of an alloyed region beyond the depth of 200 μm, and "⊙" if the applied amount of brazing material was less than 10 μm and the intermediate layer 24 was alloyed by a depth of 100 μm or smaller.

The samples were joined under a pressure of 3.5 MPa in a vacuum of $1.0 \times 10^{-5}$ Torr or lower at a temperature of 830° C. for 10 minutes.

The bonding strength was judged by pulling the samples 1 through 23 and determining whether the joined interfaces were peeled off (NG) or not and whether the heat spreader member 14 was fractured (OK) or not.

The squeezed amount of active hard brazing material 80 was measured as follows: Attention was directed to the circuit board 26 which is substantially not alloyed by an active hard brazing material that has been squeezed out, and the amount of active hard brazing material 80 squeezed out from between the circuit board 26 and the insulating board 22 positioned therebeneath was measured, after which the measured amount was multiplied by 4.

The details of the samples 1 through 23 (the compositions of the first through fourth active hard brazing materials 18, 20, 28, 30, the supplied amounts of the first through fourth active hard brazing materials 18, 20, 28, 30, and the amounts of contained Ti) and the measured results are shown in FIG. 17. In FIG. 17, W1 represents the supplied amounts of the first through fourth active hard brazing materials 18, 20, 28, 30, W2 represents the amounts of contained Ti, λm represents the thermal conductivities of the heat spreader modules 10, and hm represents the squeezed amounts of the first through fourth active hard brazing materials 18, 20, 28, 30.

With respect to the compositions of the first through fourth active hard brazing materials 18, 20, 28, 30 in the description which follows, those materials having a composition of 60Ag-24.7Cu-14In-1.3Ti are referred to as "1.3Ti material", those materials having a composition of 59.8Ag-24Cu-14In-2.2Ti as "2.2Ti material", those materials having a composition of 58.4Ag-23.5Cu-13.5In-4.5Ti as "4.5Ti material", and those materials having a composition of 58Ag-22Cu-13In-7Ti as "7Ti material".

First, the bonding strength in the measured results shown in FIG. 17 will be described below. Of the samples 1 through 4 which employed the 1.3Ti material, the samples 1 through 3 are judged as "NG", and a critical point of the amount of contained Ti for judging the samples 1 through 3 as "NG" exists between 378.3 μg/cm$^2$ of the sample 3 and 630.5 μg/cm$^2$ of the sample 4.

Of the samples 5 through 11 which employed the 2.2Ti material, the samples 5 through 7 are judged as "NG", and a critical point of the amount of contained Ti for judging the samples 5 through 7 as "NG" exists between 213.4 μg/cm$^2$ of the sample 7 and 320.1 μg/cm$^2$ of the sample 8.

Of the samples 12 through 17 which employed the 4.5Ti material, the sample 12 is judged as "NG", and a critical point of the amount of contained Ti for judging the sample 12 as "NG" exists between 218.25 μg/cm$^2$ of the sample 12 and 327.6 μg/cm$^2$ of the sample 13.

Of the samples 18 through 23 which employed the 7Ti material, no sample is judged as "NG", and a critical point of the amount of contained Ti for judging samples as "NG" exists below 339.5 μg/cm$^2$.

Those samples which had thermal conductivities less than 350 W/mK include the sample 11 (whose Ti content was 1067 μg/cm$^2$, the sample 16 (whose Ti content was 873 μg/cm$^2$, the sample 17 (whose Ti content was 1309.5 μg/cm$^2$, the sample 21 (whose Ti content was 1018.5 μg/cm$^2$, the sample 22 (whose Ti content was 1358 μg/cm$^2$, and the sample 23 (whose Ti content was 2037 μg/cm$^2$).

Therefore, a critical point for determining the thermal conductivity of 350 W/mK exists between 873 μg/cm$^2$ of the sample 16 and 1067 μg/cm$^2$ of the sample 11.

The alloyed state of the intermediate layer 24 was judged as "x" in the samples 3, 10, 17, 23 where the first through fourth active hard brazing materials 18, 20, 28, 30 were supplied in an amount of 29.1 mg/cm$^2$, and the samples 4, 11 where the first through fourth active hard brazing materials 18, 20, 28, 30 were supplied in an amount of 48.5 mg/cm².

The supplied amount of 29.1 mg/cm² for the active hard brazing materials 18, 20, 28, 30 may be converted into a thickness of 30 μm at the time they are supplied, and the supplied amount of 48.5 mg/cm² for the active hard brazing materials 18, 20, 28, 30 may be converted into a thickness of 50 μm at the time they are supplied.

It can be seen from the results of the seventh Experimental Example that if the thickness of the active hard brazing materials 18, 20, 28, 30 when they are supplied is less than 20 μm and the amount of contained Ti is in the range from 426.8 to 1358 μg/cm², then it is possible for the heat spreader module 10 to have a thermal conductivity of 350 W/mK or higher and a sufficient bonding strength, and to be essential free of alloying in the intermediate layer 24.

Although certain preferred embodiments of the present invention have been shown and described in detail, it should be understood that various changes and modifications may be made therein without departing from the scope of the appended claims.

What is claimed is:

1. A heat spreader module comprising active hard brazing materials, each containing Ti, between a pedestal, a heat spreader member, an insulating board, and a metal plate, said pedestal, said heat spreader member, said insulating board, and said metal plate being pressed and heated, thereby joining said pedestal, said heat spreader member, said insulating board, and said metal plate together, said active hard brazing materials each being one of (i) Ag—Cu—In—Ti and (ii) a mixture of hard brazing material of Ag—Cu—In and Ti, each of said active hard brazing materials being supplied in an amount ranging from 4.85 to 19.4 mg/cm², said active element of said active hard brazing materials being contained in an amount ranging from 426.8 to 1358 μg/cm², said metal plate including a marginal edge of alloy extending inward from a distal side edge of said metal plate a distance no greater than 200 μm, said marginal edge of alloy being created by an amount of said active hard brazing materials squeezed out beyond said distal side edge of said metal plate, and said heat spreader member having a thermal conductivity of 150 W/mK or greater.

2. The heat spreader module according to claim 1, wherein said marginal edge of alloy includes constituent elements of said active hard brazing materials.

* * * * *

UNITED STATES PATENT AND TRADEMARK OFFICE
CERTIFICATE OF CORRECTION

PATENT NO.       : 7,433,187 B2                                    Page 1 of 1
APPLICATION NO.  : 10/807674
DATED            : October 7, 2008
INVENTOR(S)      : Takahiro Ishikawa et al.

It is certified that error appears in the above-identified patent and that said Letters Patent is hereby corrected as shown below:

Title Page, Item (56), References Cited
    U.S. Patent Documents: please add --6,451,449   9/2002    Asakura-- and --5,844,310    12/1998    Okikawa--

Column 10
    *Line 42*: please change "24.7Cu-14In-13Ti" to --24.7Cu-14IN-1.3Ti--

Signed and Sealed this

Third Day of February, 2009

JOHN DOLL
*Acting Director of the United States Patent and Trademark Office*